United States Patent
Redondo et al.

(10) Patent No.: US 11,423,985 B2
(45) Date of Patent: Aug. 23, 2022

(54) DEVICES AND METHODS FOR CONTROLLING WRITE OPERATIONS

(71) Applicant: Arm Limited, Cambridge (GB)

(72) Inventors: Fernando Garcia Redondo, Cambridge (GB); Shidhartha Das, Upper Cambourne (GB); Glen Arnold Rosendale, Palo Alto, CA (US); George McNeil Lattimore, Austin, TX (US); Mudit Bhargava, Austin, TX (US)

(73) Assignee: Arm Limited, Cambridge (GB)

( * ) Notice: Subject to any disclaimer, the term of this patent is extended or adjusted under 35 U.S.C. 154(b) by 202 days.

(21) Appl. No.: 16/582,743

(22) Filed: Sep. 25, 2019

(65) Prior Publication Data

US 2021/0090653 A1    Mar. 25, 2021

(51) Int. Cl.
*G11C 13/00*    (2006.01)

(52) U.S. Cl.
CPC ........ *G11C 13/0069* (2013.01); *G11C 13/003* (2013.01); *G11C 13/0026* (2013.01); *G11C 13/0028* (2013.01); *G11C 2213/79* (2013.01)

(58) Field of Classification Search
CPC ............ G11C 13/0069; G11C 13/0028; G11C 13/003; G11C 13/0026; G11C 2213/79; G11C 11/56; G11C 2213/74; G11C 2213/82
See application file for complete search history.

(56) References Cited

U.S. PATENT DOCUMENTS

| 7,511,986 B2* | 3/2009 | Horii | G11C 13/0069 365/158 |
| 2004/0264244 A1* | 12/2004 | Morimoto | G11C 11/5685 365/180 |
| 2010/0182820 A1* | 7/2010 | Kitagawa | G11C 13/0069 365/148 |
| 2016/0019962 A1* | 1/2016 | Haukness | G11C 13/004 365/148 |

OTHER PUBLICATIONS

García-Redondo, et al.; Self-Controlled Multilevel Writing Architecture for Fast Training in Neuromorphic RRAM Applications; Nanotechnology 29; IOP Publishing; Jul. 31, 2018.

(Continued)

*Primary Examiner* — Mohammed A Bashar
(74) *Attorney, Agent, or Firm* — Pramudji Law Group PLLC; Ari Pramudji (57) ABSTRACT

In a particular implementation, a method includes: providing a first voltage to a word-line coupled to a first transistor device; providing a second voltage to a bit-line coupled to the first transistor device; providing a third voltage to a source-line coupled between a programmable resistive device and a voltage control element. Also, the first transistor device is coupled to the programmable resistive device and the voltage control element, where the programmable resistive device is configured to replace a first data value by writing a second data value in the programmable resistive device. Moreover, in response to a voltage difference across the programmable resistive device exceeding a particular threshold, limiting the voltage difference by one of reducing the second voltage on the bit-line or increasing the third voltage on the source-line.

21 Claims, 7 Drawing Sheets

(56) References Cited

OTHER PUBLICATIONS

Chang, et al.; Low VDDmin Swing-Sample-and-Couple Sense Amplifier and Energy-Efficient Self-Boost-Write-Termination Scheme for Embedded ReRAM Macros Against Resistance and Switch-Time Variations IEEE Journal of Solid State Circuits; vol. 50, No. 11; Nov. 2015.

* cited by examiner

DEVICES AND METHODS FOR CONTROLLING WRITE OPERATIONS

I. FIELD

The present disclosure is generally related to devices and methods for controlling write operations.

II. DESCRIPTION OF RELATED ART

Advances in technology have resulted in smaller and more powerful computing devices. For example, a variety of portable personal computing devices, including wireless telephones, such as mobile and smart phones, tablets and laptop computers are small, lightweight, and easily carried by users. These devices can communicate voice and data packets over wireless networks. Further, many such devices incorporate additional functionality, such as a digital still camera, a digital video camera, a digital recorder, and an audio file player. Also, such devices can process executable instructions, including software applications, such as a web browser application, that can be used to access the Internet. As such, these devices can include significant computing and networking capabilities.

Random access memory (RAM) is a ubiquitous component of modern digital architectures. RAM can be a stand-alone device or can be integrated in a device that uses the RAM, such as a microprocessor, microcontroller, application specific integrated circuit (ASIC), system-on-chip (SoC), and other like devices. RAM can be volatile or non-volatile. Resistive random-access memory (ReRAM or RRAM) is a type of non-volatile RAM computer memory that works by changing the resistance across a dielectric solid-state material. Magneto-resistive Random-Access Memory (MRAM) is a non-volatile memory (NVM) technology having response (read/write) times comparable to volatile memory. In contrast to conventional RAM technologies, which store data as electric charges or current flows, MRAM uses magnetic elements. Other widely utilized memory technologies include: Phase Change Memory (PCM), Correlated Electron random-access memory (Ce-RAM), and Ferroelectric random-access memory (FeRAM), each utilizing different resistive memory elements to store data.

One common concern applicable for each these above-mentioned memory technologies include "wear out" of their respective memory elements. Often this may occur during write processes when there is an abruptness to a "SET" process or an "over-SET" condition. For instance, during a write operation, an example resistive memory element may transition too rapidly or continue to receive write voltage when an actual write has already been achieved (i.e., a transition of the resistive memory element been made from a high resistance state (HRS) to a low resistance state (LRS)). Accordingly, the capacity to extend the effective lifetime of such memory elements of respective memory devices is an ongoing need in the art.

II. BRIEF DESCRIPTION OF THE DRAWINGS

The present technique(s) will be described further, by way of example, with reference to embodiments thereof as illustrated in the accompanying drawings. It should be understood, however, that the accompanying drawings illustrate only the various implementations described herein and are not meant to limit the scope of various techniques, methods, systems, circuits or apparatuses described herein.

Reference is made in the following detailed description to accompanying drawings, which form a part hereof, wherein like numerals may designate like parts throughout that are corresponding and/or analogous. It will be appreciated that the figures have not necessarily been drawn to scale, such as for simplicity and/or clarity of illustration. For example, dimensions of some aspects may be exaggerated relative to others. Further, it is to be understood that other embodiments may be utilized. Furthermore, structural and/or other changes may be made without departing from claimed subject matter. References throughout this specification to "claimed subject matter" refer to subject matter intended to be covered by one or more claims, or any portion thereof, and are not necessarily intended to refer to a complete claim set, to a particular combination of claim sets (e.g., method claims, apparatus claims, etc.), or to a particular claim. It should also be noted that directions and/or references, for example, such as up, down, top, bottom, and so on, may be used to facilitate discussion of drawings and are not intended to restrict application of claimed subject matter. Therefore, the following detailed description is not to be taken to limit claimed subject matter and/or equivalents.

IV. DETAILED DESCRIPTION

According to one implementation of the present disclosure, a method to: terminate a write operation in one or more memory cells (e.g., bit-cells or multi-bit cells) in one or more columns of a memory array; prevent an over-SET condition; and dynamically control voltage in a write operation is disclosed. In a particular implementation, a method includes: providing a first voltage to a word-line coupled to a first transistor device; providing a second voltage to a bit-line coupled to the first transistor device; providing a third voltage to a source-line coupled between a programmable resistive device and a voltage control element. Also, the first transistor device is coupled to the programmable resistive device and the voltage control element, where the programmable resistive device is configured to replace a first data value by writing a second data value in the programmable resistive device. Moreover, in response to a voltage difference across the programmable resistive device exceeding a particular threshold, limiting the voltage difference by one of reducing the second voltage on the bit-line or increasing the third voltage on the source-line.

According to one implementation of the present disclosure, an integrated circuit includes: a first transistor; and a programmable resistive device, where the programmable resistive device is configured to replace a first data value by writing a second data value in the programmable resistive device, and where at least one or more of series connected components of the first access device, the programable resistive device, and a voltage control element is configured to limit a voltage difference across the programmable resistive device.

Particular implementations of the present disclosure are described below with reference to the drawings. In the description, common features are designated by common reference numbers throughout the drawings.

Advantageously, inventive aspects of the present invention involve devices and methods to "self-limit" (i.e., self-control, dynamically control, automatically reduce, alter, or terminate) a write operation after an actual write has been achieved. Accordingly, "wear out" of the memory device may be minimized such that it's lifetime may be extended. Advantageously, such an extension of the memory device effective lifetime can be attained regardless of the type of resistive element used in the applicable memory devices.

In certain solutions, devices and methods allow for the rapid and non-linear rise of $V_{LOAD}$ (i.e., the voltage of a node between a programmable resistive device and a voltage control element in a particular bit-cell). In such examples, the rapid and non-linear rise can enable the auto-collapsing of a write operation, the rapid sensing of the devices, and multi-level writing (for applicable memory device technologies).

Such solutions can be utilized to compensate for certain existing issues. In an example of one such issue, using an ReRAM cell, it is observed that the abruptness of a SET process in an RRAM cell can make it difficult to extend the natural ON (LRS) and OFF (HRS) state of RRAMs to a wider range of storage/programmable values (i.e., multilevel resistive states, e.g., a digital 00, 01, 10, 11). For example, the filamentary-based switching of RRAMs may be characterized by an abrupt and short SET process where the cell resistance may vary from its maximum HRS towards its minimum LRS. Correspondingly, for an example RESET process, the resistance can vary from LRS to HRS. In doing so, the resistive changes occur as a result of the creation and/or dissolution of a conductive filament (CF) that determines the state of the device.

Nevertheless, the abruptness of the SET process can endanger the lifetime of the RRAM cell by degrading the CF in every cycle due to over-SET (or over-RESET) process. For instance, after surpassing a given voltage threshold, the CF may grow significantly, and thus, reduce the gap with an opposite cell electrode. Consequently, this abrupt phenomenon may occur in extremely short periods of time, catalyzed by the increase of the CF local temperature due to Joule heating and, thus, the electric field. In contrast, the RESET process is observed to occur gradually.

Advantageously, with respect to the example RRAM cell, devices and methods disclosed herein may accurately control CF switching and provide protection against over-SET. Moreover, performance improvements may also be realized. For example, in comparison iterative stages involving write/ read pulses (requiring significantly greater programming time), example methods, as described herein, may write a particular value in a single writing cycle. In addition, the circuit design included herein may write such a value within a fixed time. Furthermore, certain exemplary devices and methods allow for writing of both linear and non-linear distributed resistance values on the respective cell. Also, some devices and methods as described herein may avoid multiple gate voltage writing schemes, and are, therefore, more robust against process-voltage-temperature (PVT) variations.

Figure 1:
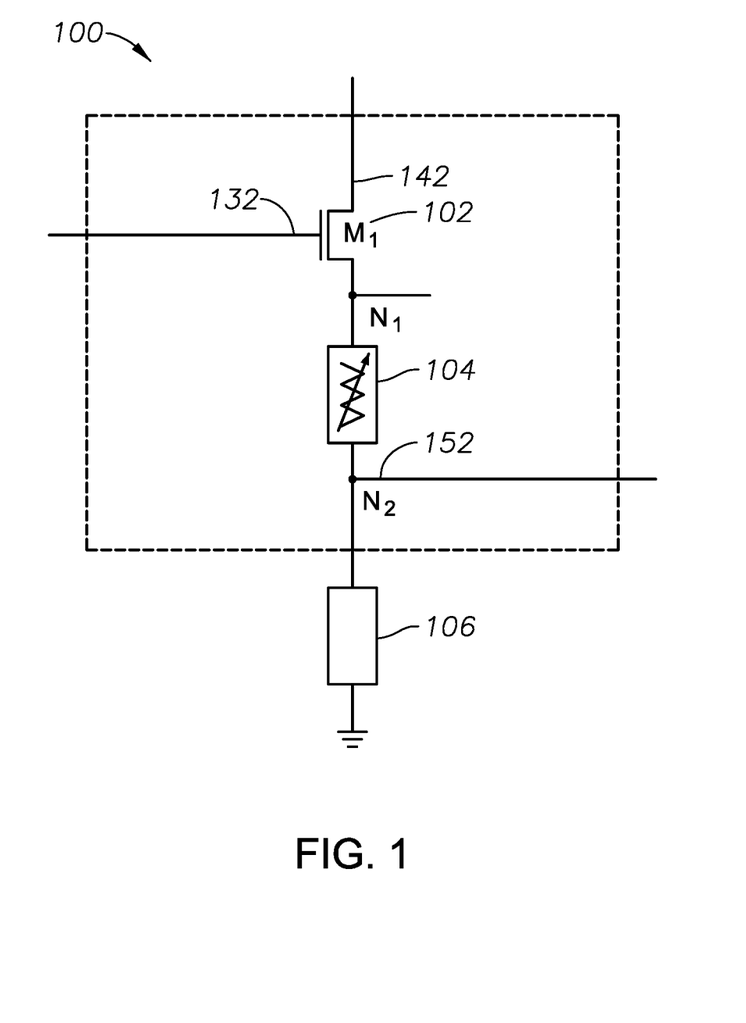
FIG. 1 is a schematic diagram of a memory cell of a memory array implementable with example methods for controlling write operations.

Referring to FIG. 1, an example circuit 100 for a random-access memory cell (e.g., RRAM, FeRAM, CeRAM, PCM, MRAM bit-cells or multi-level cells, as applicable) is shown. As depicted in FIG. 1, the example integrated circuit 100 comprises a first access device (i.e., first access transistor) (M1) (e.g., a NMOS transistor device, a write and read transistor device) 102 and a programmable resistive device 104 (i.e., a storage element, resistive memory element) (e.g., a magnetic tunnel junction (MTJ) device for an MRAM bit-cell), and a voltage control element 106. Also, as shown in FIG. 1, the first access device 102 may be coupled to a word line (WL) 132 and a bit line (BL) 142, while the voltage control element 106 may be coupled to a source line (SL) 152. In certain instances, the voltage control element 106 can include one of a capacitor (i.e., a capacitive load) (e.g., FIGS. 3, 4), a resistor (i.e., a fixed resistor) (e.g., FIG. 6), or a second access device (i.e., second access transistor) (M2) (e.g., a NMOS transistor device, a write and read transistor device) (e.g., FIGS. 7-10). In such instances, the first access device 102 is coupled to a programmable resistive device 104 and a voltage control element 106, where the programmable resistive device 104 is configured to replace a first data value by writing a second data value in the programmable resistive device 104.

Figure 7:
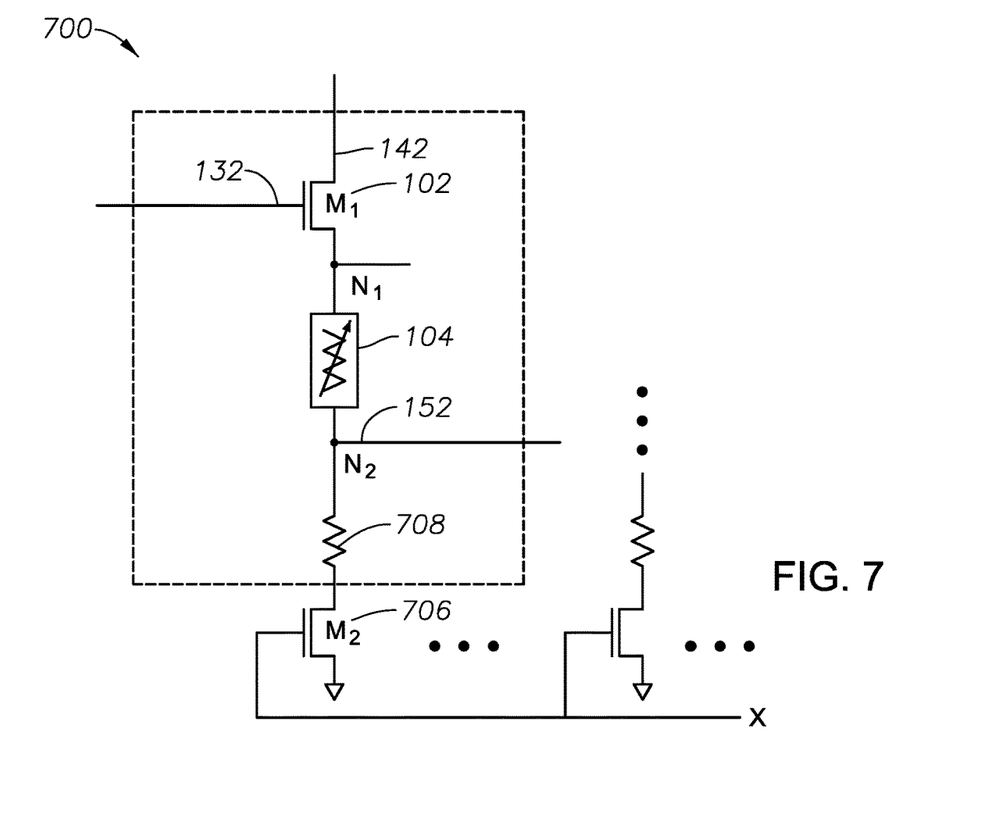
FIG. 7 is a schematic diagram of a memory cell of a memory array implementable with example methods for controlling write operations.
Figure 8:
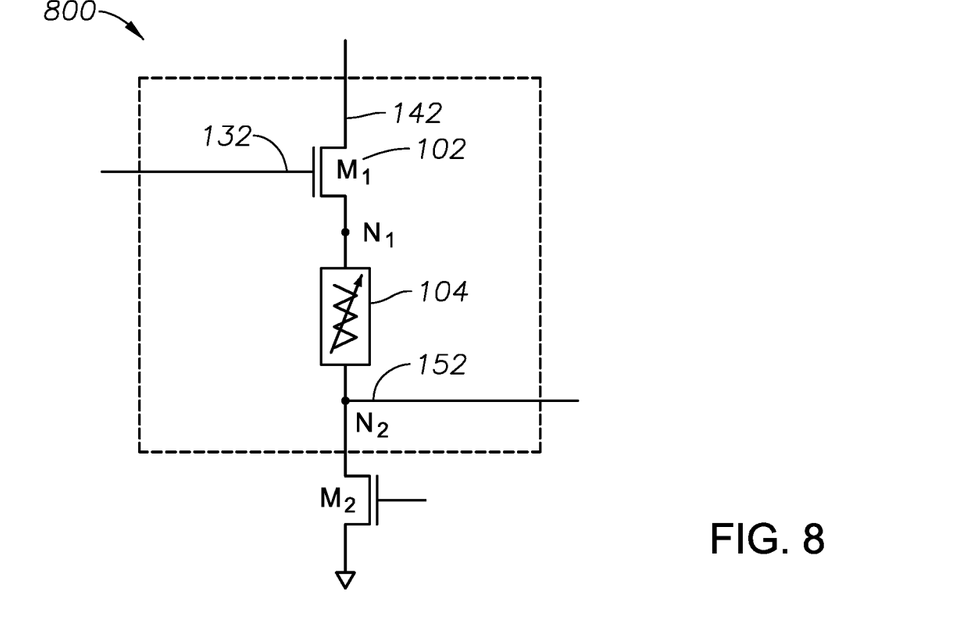
FIG. 8 is a schematic diagram of a memory cell of a memory array implementable with example methods for controlling write operations.

In other circuit implementations (for example as shown in FIGS. 7-8 below), while the first access device 102 and the programmable resistive device 104 may be included as part of the example circuit 100, the voltage control element 106, on the other hand, may be located outside of the example circuit 100. For instance, in one particular case where the voltage control element 106 is the second transistor device (M2), the voltage control element may be common access transistor for an entire column of bit-cells (or multibit-cells).

The programmable resistive device 104 may include memory elements for memory devices including, but not limited, ReRAM, FeRAM, CeRAM, PCM, and MRAM. In various implementations, as described with reference to FIG. 1 (as well as FIGS. 2-11 as described herein), in response to a voltage difference across the programmable resistive device 104 having exceeded a particular threshold, the voltage difference may be limited by one of either a reduction of a second voltage on the bit-line 142 or an increase of the third voltage on the source-line 152. Moreover, in such an example, the voltage difference may be configured to be further limited by at least one or more of the first access device 102, the programmable resistive device 104, and the voltage control element 106.

Also, in certain cases, the first access device 102, the programmable resistive device 104, and the voltage control element 106 are coupled in a series arrangement. Moreover, the first access device 102, the programmable resistive device 104, and the voltage control element 106 may be configured in series, where a first node (N1) may be between the first access device and the programmable resistive device, and a second node (N2) may be between the programmable resistive device 104 and the voltage control element 106.

Figure 2:
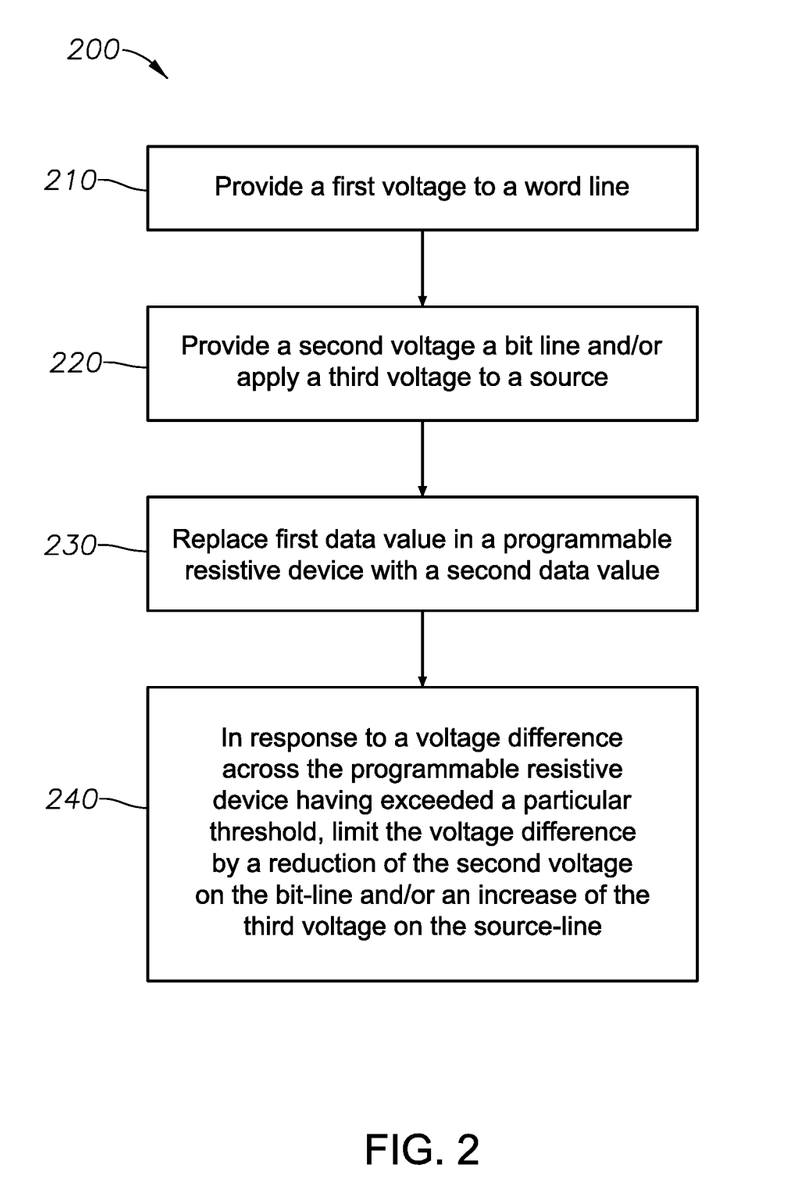
FIG. 2 is a flowchart of a particular illustrative aspect of methods of controlling write operations.

Referring to FIG. 2, an example method 200 (i.e., method 200) applicable for the above-described example bit-cell 100 is shown. The method 200 may be used: to terminate a write operation in one or more memory cells in one or more columns of a memory array; to prevent an over-SET condition; and to dynamically control voltage in a write operation. While described with reference to the bit-cell 100 in FIG. 2, the method 200 may be performed in any of the circuit designs described herein including circuits 100, 300, 400, 600, 700, 800, 900, and 1000 as described with reference to FIGS. 1, 3, 4, and 6-10.

With reference to FIGS. 1 and 2, for each bit-cell, data may be copied onto the respective programmable resistive device. Initially, for example, at block 210 (as shown in FIG. 2), a first voltage (V1) (i.e., activation voltage) is applied to the word line 132 that is coupled to the first access device 102. Next, at block 220, in accordance with read and write functionality on the bit line 142, a second voltage (V2) can be applied ("fed" as write voltage) to the bit line 142 that is coupled to the first access device 102 and/or a third voltage (V3) can be applied ("fed" as write voltage) to the source line 152 that is coupled between the programmable resistive device 104 and the voltage control element 106. In doing so, at block 230, the programmable resistive device 104 can be configured to replace a first data value (e.g., a digital "1") by writing a second data value ("0", or data values corresponding to other resistive levels for MLC operation) (i.e., is configured to transition from HRS to LRS) in the programmable resistive device 104. Also, at block 240, after writing the second data value, in response to a voltage difference across the programmable resistive device 104 having exceeded a particular threshold, the voltage difference may be limited (e.g., altered, reduced, terminated: by increasing the rate at which the write operation is collapsing) by a reduction of the second voltage (V2) on the bit-line 142 and/or an increase of the third voltage (V3) on the source-line 152.

In alternative or additional steps, the operation 200 may include: after writing the second data value, in response to a voltage difference across the programmable resistive device 106 having exceeded a particular threshold, the voltage difference may be limited (i.e., altered) by at least one or more of the series connected components of the first access device 102, the programable resistive device 104, and/or the voltage control element 106.

Moreover, in alternative or additional steps, the operation 200 may include: after writing the second data value, determining whether to limit the voltage difference (e.g., either through an active or passive determination) across the programmable resistance device 104 by one of either a reduction of the second voltage (V2) on the bit-line 142 or an increase of the third voltage (V3) on the source-line 152.

Figure 3:
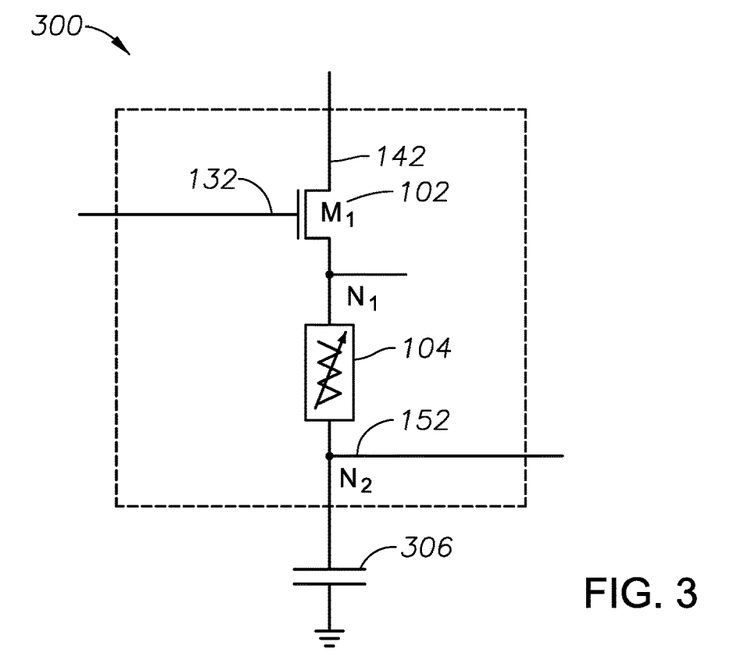
FIG. 3 is a schematic diagram of a memory cell of a memory array implementable with example methods for controlling write operations.

Referring to FIG. 3, an example circuit 300 for a memory cell (e.g., RRAM, FeRAM, PCM, MRAM bit-cell, bit-cell or multibit-cell, as applicable) is shown. As depicted in FIG. 3, the example integrated circuit comprises the first access device (i.e., first access transistor) (M1) (e.g., a NMOS transistor device, a write and read transistor device) 102, the programmable resistive device 104 (i.e., a storage element, resistive memory element) (e.g., a magnetic tunnel junction (MTJ) device for an MRAM bit-cell), and a capacitor 306 (i.e., a capacitive load) as the voltage control element 106. Similar to FIG. 1, the first access device 102 may be coupled to a word line (WL) 132 and a bit line (BL) 142, while the voltage control element 106 may be coupled to a source line (SL) 152. Moreover, as shown in FIG. 3, the first access device 102 is coupled to a programmable resistive device 104 and the capacitor 306, where the programmable resistive device 104 is configured to replace a first data value by writing a second data value in the programmable resistive device 104.

In an operation, initially, a voltage ($V_L$) at a second node (N2) may be set at 0 volts. The second node (N2) may then charge depending on the resistance value of the programmable memory device 104 as well as the capacitor 306. As $V_L$ increases its voltage with an exponential constant tau_1 (i.e., first RC constant) (corresponding to an HRS value (circuit resistance in ohms))*C (load capacitor values over a given time interval in farads), the voltage fed to the programmable memory device 104 may be reduced. Consequently, once the programmable memory device 104 switches form HRS to LRS, the charging constant of the programmable memory device 104 may gradually change to follow a second exponential constant tau_0 (i.e., second RC constant) (corresponding to an LRS (circuit resistance in ohms))*C (load capacitor values over a given time interval in farads)). Accordingly, this process may drastically reduce the voltage fed to the cell, and, therefore, "strangle" the switching to prevent an over-SET occurrence.

In certain examples, to provide further explanation, if initially $V_L$ is 0, and $V_{WRITE}$=1.5V, the first voltage (V) would go from 0 to 1V. If the capacitor 306 is assumed to be infinitely large, $V_L$ would remain 0, as whatever amount of current on $V_L$ would effectively appear as ground. In contrast, if the capacitor 306 is relatively small, the voltage on $V_L$ would "float" before a write occurs on the memory device 104. As current continues to pass through the bit-cell, $V_L$ would go high ($V_L$=a digital "1" value). Hence, the voltage that the programmable memory device 104 would see is a voltage difference between $V_{WRITE}$ and $V_{LOAD}$ ($V_L$). Accordingly, if $V_L$ is quickly following $V_{WRITE}$, the voltage across memory device 104 would collapse quickly. Also, depending on the value of the capacitor 306, the rate at which V L tries to follow $V_{WRITE}$ may be altered. Thus, the RC constant corresponds to the resistance of the programmable device (either HRS or LRS) multiplied by the capacitance value (C). Consequently, as a result of the changing voltage at the second node (N2), the shift from HRS to LRS would occur, and accordingly, the smaller LRS value would make the RC constant smaller. Thus, the rate at which the voltage collapses across the programmable memory device 104 would be faster.

In addition, as an advantage, by placing a particular capacitive load (e.g., capacitor 306), the fed voltage as well as the CF local temperature that catalyzes the switching may be accurately controlled. Hence, controlled writing of the desired value in a target cell may be accomplished. To do so, a circuit design including a simple Finite State Machine (FSM) to control the overall operation may be utilized. In such an operation, the FSM may first reset a target cell to a known resistive value (e.g., HRS) and later may select the resistive load that can optimally fit the required operation scheme.

Figure 4:
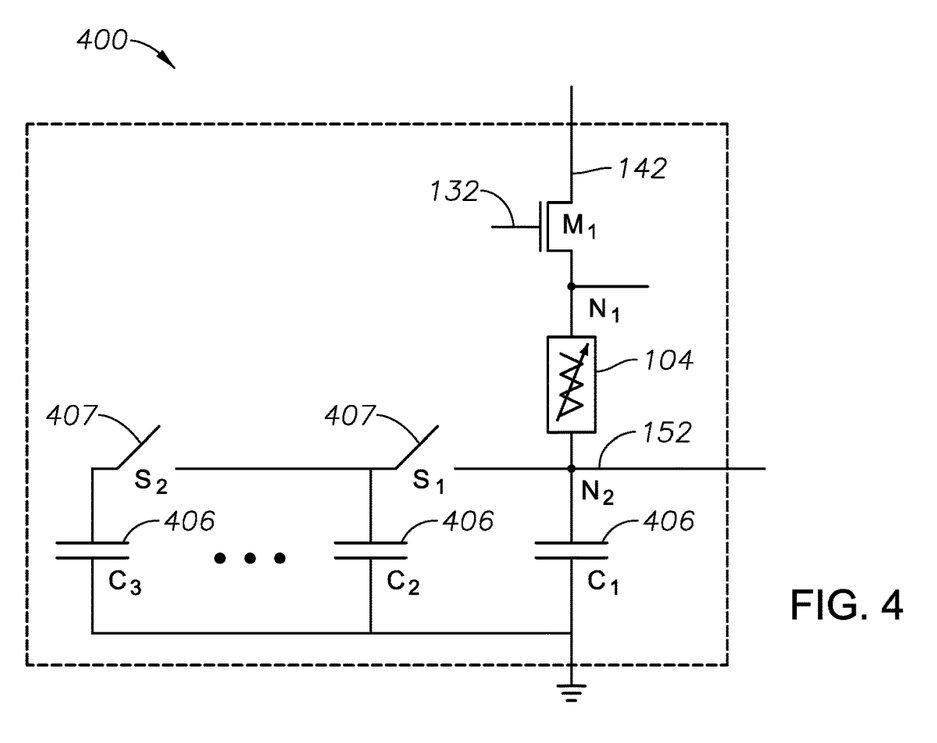
FIG. 4 is a schematic diagram of a memory cell of a memory array implementable with example methods for controlling write operations.

Referring to FIG. 4, an example circuit 400 for a memory cell (e.g., RRAM, FeRAM, CeRAM, PCM, MRAM bit-cell, bit-cell or multibit-cell, as applicable) is shown. As illustrated, the example circuit design in FIG. 4 includes additional circuit components to the circuit design in FIG. 3. In FIG. 4, the example integrated circuit comprises the first access device (i.e., first access transistor) (M1) (e.g., a NMOS transistor device, a write and read transistor device)

102, the programmable resistive device 104 (i.e., a storage element, resistive memory element) (e.g., a magnetic tunnel junction (MTJ) device for an MRAM bit-cell), one or more capacitors 406 (i.e., a capacitive load) (e.g., three capacitors C1, C2, C3) (as the voltage control element 106, and respective one or more switches 407 (e.g., two switches S1, S2, etc.) connected in parallel to the one or more capacitors 406. Similar to FIG. 1, the first access device 102 may be coupled to a word line (WL) 132 and a bit line (BL) 142, while the one or more capacitors 406 may be coupled to a source line (SL) 152. Moreover, as shown in FIG. 4, the first access device 102 is coupled to the programmable resistive device 104 and the one or more capacitors 406, where the programmable resistive device 104 is configured to replace a first data value by writing a second data value in the programmable resistive device 104.

With reference to FIG. 4, in certain cases, each of the one or more capacitors 406 may be configured to provide different (i.e., unequal) capacitive loads for the example circuit 400. Moreover, calibration of the circuit design 400 may be voltage dependent. For instance, based on predetermined known characteristics (i.e., amplitude, length) of the write voltage (e.g., the second voltage (V2), third voltage (V3), or both), prior to operation, one of the capacitive loads may be selected for usage. Suitably, such a circuit design allows for the capability to vary the effective capacitance that is shown on the example cell (e.g., RRAM cell). Advantageously, in doing so, a designer has the capacity to control switching to obtain multiple (varying) levels of resistance.

In further explanation, by having multiple capacitive loads, different MLC values may be written. For instance, by adding different capacitive loads, different RC constants would be observed, and thus, the voltage across the programmable resistive device 104 for each of the different capacitive loads connected to the second node (N2) would be different. Accordingly, different values in the multibit-cell may be programmed in the programmable resistive device 104.

In another circuit implementation (not shown), in addition to either FIG. 3 or 4, a multiplexer can be coupled to the bit line (BL). In certain implementations, the multiplexer can be configured to provide different paths for writing a data value in the resistive element and reading the data value (i.e., sensing voltage/current corresponding the data value). In some cases, the one or more capacitive loads can be achieved by using CMOS transistors, and thus, reducing the overall circuit area as well as improving performance against variability. Moreover, the second node (N2) (similar to the second node N2 in FIG. 3), once charged, by utilizing the multiplexer, can include a different path to determine the state of the memory cell. In certain instances, the second node (N2) can be discharged using the current flowing through the memory cell, thereby, determining its resistance. For example, in such instances, a generic load may be used to read the data value after the writing to ensure the correctness of the operation.

In operation, with reference to FIGS. 3 and 4, for example, when the voltage control element 106 includes a capacitor, limiting the voltage difference (either actively or passively determining whether to limit an application of the second or third voltage to the bit line or the source line, respectively) may be based on a rate (i.e., speed) of change of the voltage ($V_L$) (i.e., $V_{LOAD}$) at the second node (N2) (i.e., a node between the programmable resistive device 104 and the voltage control element 106). In certain instances, the rate of change of the voltage at the second node (N2) corresponds to a rate of change of the RC slope and a rate of collapse of virtual ground.

In such an implementation, limiting the voltage difference (either actively or passively determining whether to limit an application of the second or third voltage to the bit line or the source line, respectively) may include the following procedure. Initially, at step 310, the second node (N2) may be charged based on one or more of the first, second, and third voltages (V1, V2, and/or V3) (e.g., $V_{WRITE}$), and a first circuit resistance-circuit capacitance (RC) time constant (i.e., tau_1; curve corresponding to HRS values*load capacitor values over a time interval), where the RC time constant corresponds to a first resistance value (i.e., a HRS value). Next, at step 320, in response to the second node voltage (N2) exceeding a first threshold level, the second voltage (V2), the third voltage (V3), or both, may be at least partially decreased. Moreover, at step 330, upon writing the second data value ("0") (e.g., performing "cell switching"), charging the second node (N2) based on the second voltage and a second circuit resistance-circuit capacitance (RC) time constant (i.e., tau_0; curve corresponding to LRS values*load capacitor values over time), where a second circuit resistance corresponds to a second resistance value (i.e., an LRS value; smaller resistance—so time constant smaller, Vwrite path faster, $V_L$ rises faster). Next, at step 330, in response to the second voltage (V2), the third voltage (V3), or both substantially equaling the second node (N2) voltage, reducing the second voltage (V2), the third voltage (V3), or both (or in some instances, drastically reducing to terminating the second and/or third voltages (V2, V3) that are "fed" to the programmable resistive element).

Figure 5:
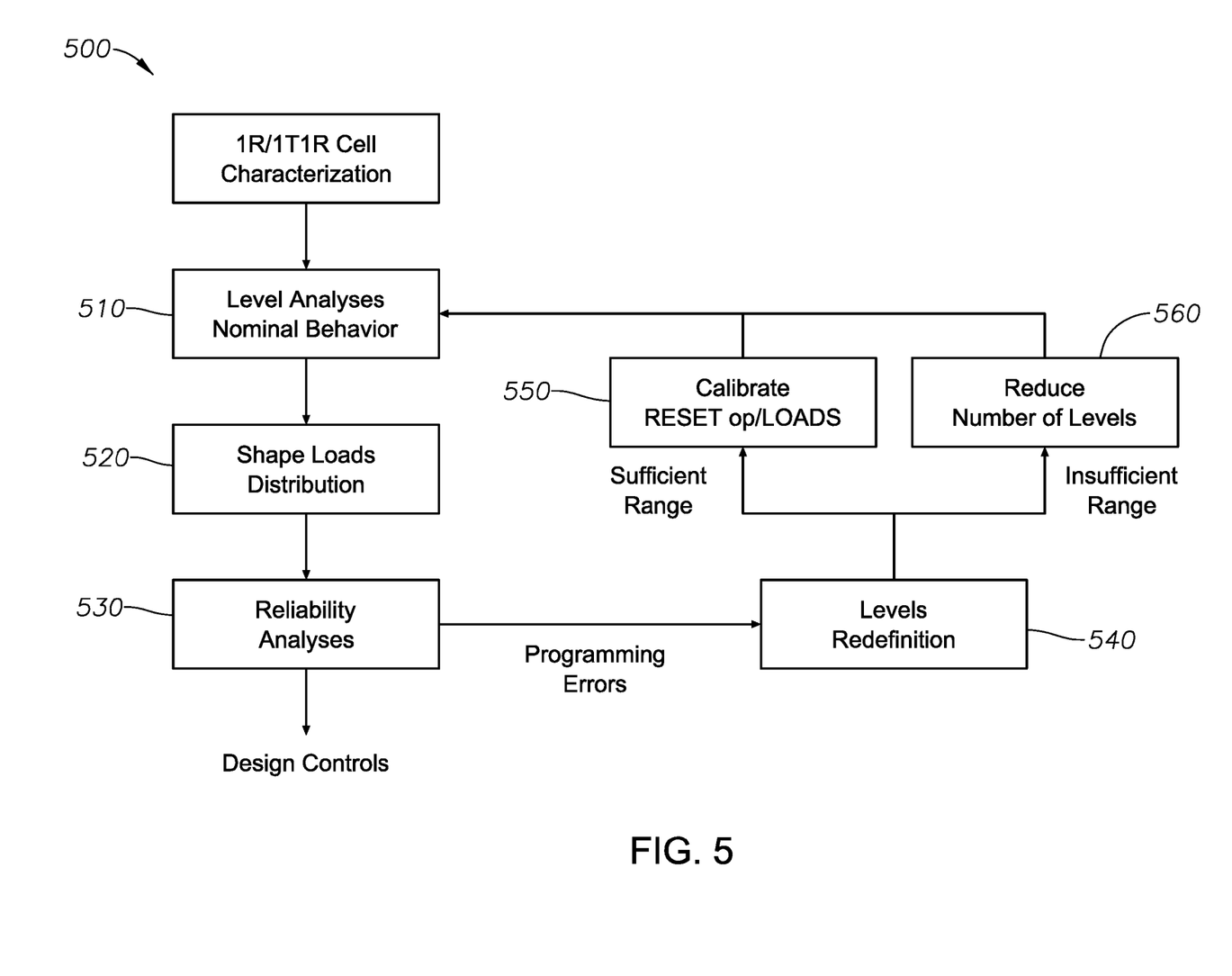
FIG. 5 is a flowchart implementable with example methods for controlling write operations.

Referring to FIG. 5, an optimization flowchart 500 to select a required capacitive load is shown. In a particular example, with reference to FIG. 5, the optimization flowchart 500 methodology may include: at step 510, (1) evaluating capacitive levels nominal behavior; at step 520, (2) shaping distributions of the capacitive loads; at step 530, (3) evaluating based on reliability criteria, and (4) providing a selected capacitive load. In certain instances, the selected capacitive load can be configured to control a particular resistance data value of the resistive device. Moreover, if during the evaluation, errors are detected, the steps of selection further comprises: at step 540, defining (redefining) capacitive levels, where if the capacitive levels are in a first range within a particular threshold (a sufficient range), at step 550, calibrating a selected range of capacitive loads (i.e., Calibrate RESET op/LOADS), and where if the capacitive levels are in a second range outside of the particular threshold (an insufficient range), at step 560, reducing a quantity of the capacitive levels.

With further reference to FIG. 5, in order to solve variability effects, it may be required to reallocate different levels constraining a valid resistive range and select the most suitable initial CF configuration. Following the optimization flowchart, Monte Carlo analysis may be iteratively performed and subsequently, automatically performed based on the required calibration steps. At the end of the process, the optimal operation range for the memory cells together with the maximum achievable levels can be determined.

Figure 6:
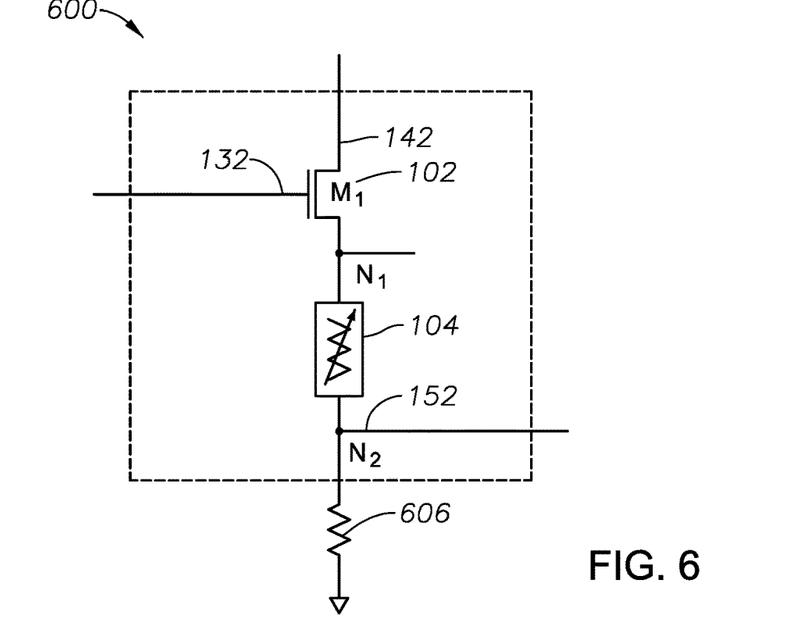
FIG. 6 is a schematic diagram of a memory cell of a memory array implementable with example methods for controlling write operations.

Referring to FIG. 6, an example circuit 600 for a memory cell (e.g., RRAM, FeRAM, PCM, CeRAM, MRAM bit-cell, bit-cell or multi-level cell) is shown. As depicted in FIG. 6, the example integrated circuit comprises the first access device (i.e., first access transistor) (M1) (e.g., a NMOS transistor device, a write and read transistor device) 102, the programmable resistive device 104 (i.e., a storage element, resistive memory element) (e.g., a magnetic tunnel junction (MTJ) device for an MRAM bit-cell), and a resistor 606 (e.g., a fixed resistor) as the voltage control element 106. Similar to FIG. 1, the first access device 102 may be coupled to a word line (WL) 132 and a bit line (BL) 142, while the voltage control element 106 may be coupled to a source line (SL) 152. Moreover, as shown in FIG. 6, the first access device 102 is coupled to a programmable resistive device 104 and the resistor 606, where the programmable resistive device 104 is configured to replace a first data value by writing a second data value in the programmable resistive device 104.

In one example, if the programmable resistive device 104 is switching (i.e., transitioning) from $R_H$ (i.e., the resistance at the first node (N1) corresponding to HRS) to $R_L$ (i.e., the resistance at the second node (N2) corresponding to LRS), where, for instance, 1 $R_H$=100 $R_L$, it may be observed what occurs when a fixed resistor (having a resistance $R_F$) is placed in the write path (i.e., in a series connection). In such an example, the fixed resistor 606 may include, for instance, a fixed resistance of 1 $R_F$=5 $R_L$. In other examples, other resistance values may be used for the relationships between $R_H$, $R_F$, and $R_L$. Accordingly, prior to the switching (e.g., when there is no voltage drop over the programmable resistive device 104), by voltage division, the voltage ($V_L$) at the second node (N2) is $\frac{1}{21}$ of the voltage ($V_H$) at the first node (N1). Therefore, at this moment, the majority ($\frac{20}{21}$th) of the voltage is seen across the bit-cell. However, upon a transition from HRS to LRS, the voltage $V_L$ is seen to be ⅚th of the voltage of $V_H$, and only a small amount (⅙th) of the voltage $V_H$ is seen across the resistive device 104. Accordingly, due to a large resistance that is coupled in series, for example the fixed resistor 606, the voltage across the bit-cell may automatically collapse. Advantageously, through such a circuit implementation, the bit-cell would incur less stress and less current flow throughout the bit-cell because the existence of $R_F$. Hence, endurance benefits as well as power-saving benefits may be achieved. In this manner, while there is no explicit sensing or direct detection, the change of resistance provides these aforementioned benefits. Moreover, in contrast to FIG. 7 (as discussed below), the integrated circuit voltage operation in FIG. 6 may be dynamically, self-controlled in generating a local signal (gate voltage) to reduce or terminate the write voltage of the bit-cell.

Referring to FIG. 7, an example circuit 700 for a memory cell (e.g., RRAM, FeRAM, PCM, CeRAM, MRAM bit-cell, bit-cell or multi-resistance level cell) is shown. As depicted in FIG. 7, the example integrated circuit comprises the first access device (i.e., first access transistor) (M1) (e.g., a NMOS transistor device, a write and read transistor device) 102, the programmable resistive device 104 (i.e., a storage element, resistive memory element) (e.g., a magnetic tunnel junction (MTJ) device for an MRAM bit-cell), and a resistor 708. Also, a second access device 706 (e.g., a second access transistor) (M2) (as the voltage control element 106), located outside of the example circuit 700, may be a common access transistor for an entire column of the RAM bit-cells. In certain cases, a gate voltage (corresponding to a global write termination signal (X)) on the second access device 706 (M2) may be used as a global "WRITE OFF" device for the entire column of bit-cells. In FIG. 7, the first access device 102 may be coupled to a word line (WL) 132 and a bit line (BL) 142, while the second access device 706 (as the voltage control element 106) and the resistor 708 may be coupled to a source line (SL) 152. Moreover, as shown in FIG. 7, the first access device 102 is coupled in series to a programmable resistive device 104 and the second access device 706, where the programmable resistive device 104 is configured to replace a first data value by writing a second data value in the programmable resistive device 104. In contrast to FIG. 6, in FIG. 7, a global signal ($V_{DD}$, $V_{ANALOG}$, corresponding to a global write termination signal (X)) may be provided to reduce or terminate (i.e., "turn-off") the gate voltage of the second access devices (N2) of all the signals for all of the applicable column bit-cells. In certain cases, this is advantageous due to various cycle-time requirements.

Referring to FIG. 8, an example circuit 800 for a memory cell (e.g., RRAM, FeRAM, PCM, MRAM bit-cell, bit-cell or multi-bit cell) is shown. As depicted in FIG. 8, the example integrated circuit 800 comprises the first access device (i.e., first access transistor) (M1) (e.g., a NMOS transistor device, a write and read transistor device) 102, and the programmable resistive device 104 (i.e., a storage element, resistive memory element) (e.g., a magnetic tunnel junction (MTJ) device for an MRAM bit-cell). Also shown in FIG. 8, a second access device 806 (e.g., a second access transistor) (M2) that is coupled to the example integrated circuit 800 may be utilized as the voltage control element 106. Similar to FIG. 1, the first access device 102 may be coupled to a word line (WL) 132 and a bit line (BL) 142, while the second access device 806 (as the voltage control element 106) may be coupled to a source line (SL) 152. Moreover, as shown in FIG. 8, the first access device 102 is coupled in series to a programmable resistive device 104 and the second access device 806, where the programmable resistive device 104 is configured to replace a first data value by writing a second data value in the programmable resistive device 104. Similar to FIG. 6, the integrated circuit voltage operation in FIG. 8 may be dynamically, self-controlled in generating a local signal (gate voltage) to reduce or terminate the write voltage (i.e., the second voltage (V2), the third voltage (V3), or both) of the bit-cell.

With reference to FIGS. 6-8, in an example operation, if the voltage control element includes a resistor or a transistor, limiting the voltage difference may be based on a reduction of voltage across the programmable resistive element 104 upon a transition from a high-resistive state (HRS) to a low-resistive state (LRS). In certain instances, the reduction of the voltage may correspond to a voltage-reduction between the first and second nodes (N1, N2) on opposing sides of the programmable resistive element 104. Also, stated another way, the reduction of the voltage may correspond to a voltage division between the programmable resistive element 104 and the voltage control element 106 (e.g., either a resistor 606 or a second access transistor 706).

In one such implementation, with reference to FIG. 6 (where the voltage control element 106 includes a resistor 606), an example operation for limiting a voltage difference of the programmable resistive device 104 includes: 1) detecting a transition from a HRS to an LRS and 2) automatically limiting (e.g., altering, reducing, or terminating) the second voltage, the third voltage, or both based on a reduction of a voltage across the programmable resistive device 104. In certain examples, the reduction of the second voltage (V2), the third voltage (V3), or both corresponds to a decrease (e.g., a substantial decrease for termination) of the voltage difference (i.e., voltage drop) between the first (N1) and second nodes (N2) on opposing sides of the programmable resistive device 104.

In one such implementation, with reference to FIG. 7 (where the voltage control element 106 includes a resistor 606), an example operation for limiting a voltage difference of the programmable resistive device 104 includes: 1)

detecting a transition from a HRS to an LRS and 2) limiting (e.g., altering, reducing, or terminating) the second voltage, the third voltage, or both based on a reduction of a voltage across the programmable resistive device 104. In certain examples, the reduction of the second voltage (V2), the third voltage (V3), or both corresponds to a decrease (e.g., a substantial decrease for termination) of the voltage difference (i.e., voltage drop) between the first (N1) and second nodes (N2) on opposing sides of the programmable resistive device 104. In doing so, prior to the transition, the programmable resistive device 104 is configured to "sit" between an HRS and LRS state, and thus, after the transition has occurred, the programmable resistive device 104 may be configured to passively limit (e.g., alter, reduce, or terminate) the second voltage, the third voltage, or both. Advantageously, the implementation of FIG. 7 allows for global control of the example bit-cell.

In the implementation with reference to FIG. 8 (where the voltage control element 106 includes a second access device 806), an example operation for limiting a voltage difference of the programmable resistive device 104 includes: 1) detecting a transition from HRS to LRS and 2) limiting (e.g., altering, reducing, or terminating) the second voltage, the third voltage, or both based on a reduction of a voltage across the programmable resistive device 104. In certain examples, the reduction of the second voltage (V2), the third voltage (V3), or both corresponds to a decrease (e.g., a substantial decrease for termination) of the voltage difference (i.e., voltage drop) between the first (N1) and second nodes (N2) on opposing sides of the programmable resistive device 104. Accordingly, the example circuit 800 is configured to allow "sensing" on the second node (N2) (corresponding to the voltage $V_{LOAD}$ ($V_L$)) and provides the capability to change a gate voltage on the second access device (M2) after the transition from HRS to LRS has occurred. Hence, prior to the operation, initially the resistance of the second access device 806 may be very low, but after the transition, the resistance of the second access device 806 would be much higher. Thus, the implementation of FIG. 8 allows for local control of the example bit-cell.

Figure 9:
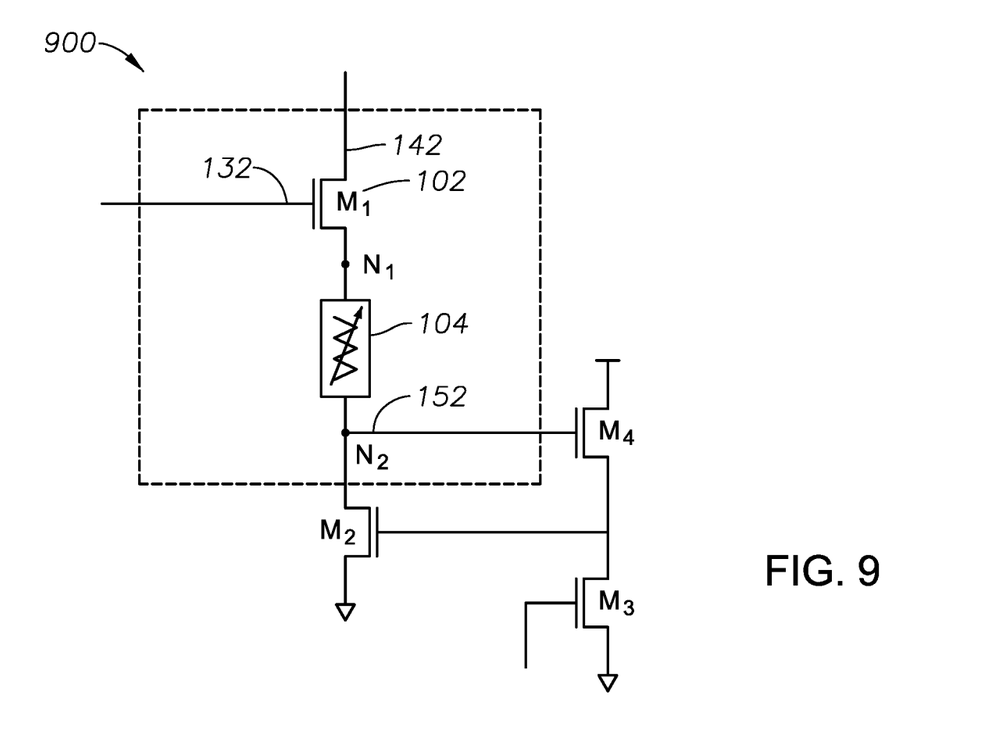
FIG. 9 is a schematic diagram of a memory cell of a memory array implementable with example methods for controlling write operations.

Referring to FIG. 9, an example circuit 900 for a RAM bit-cell (e.g., RRAM, FeRAM, PCM, MRAM bit-cell, bit-cell or multi-bit cell) is shown. As depicted in FIG. 9, the example integrated circuit 900 expands on the integrated circuit 800 (that includes a second access device (M2) 806 as the voltage control element) as shown in FIG. 8. In addition to the components and operations as described with reference to FIG. 8, in FIG. 9, the circuit 900 includes third (M3, a third NMOS device) and fourth transistors (P1, PMOS device), where the third and fourth transistors are configured to control a gate voltage of the second access device (M2) based on a write operation of the programmable resistive device 104.

Moreover, similar to FIG. 1, in FIG. 9, the first access device 102 may be coupled to a word line (WL) 132 and a bit line (BL) 142, while the second access device 906 (as the voltage control element 106) may be coupled to a source line (SL) 152. Moreover, as shown in FIG. 9, the first access device 102 is coupled in series to a programmable resistive device 104 and the second access device 906, where the programmable resistive device 104 is configured to replace a first data value by writing a second data value in the programmable resistive device 104.

In an example operation, an input signal of the third transistor (M3) may be more "digital" than the input signal to the second access transistor (M2) of FIG. 8. In the operation, the digital gate input to M3 may be defined such that when M2 is to be in a low resistance phase, the digital input to M3 is "off" and the fourth transistor P1 would "pull" the gate on M2 high (e.g., a digital "1") at least through leakage. The devices should be sized such that the P1 would cause the gate of M2 to "leak up" when the gate of M3 is off. Correspondingly, when the write operation has occurred, the digital gate input to M3 would go "high" (e.g., a digital "1", may be $V_{DD}$) which would cause M3 to turn "on" and, thus, reduce the gate voltage to M2. Further, a self-timed input to the gate of M3 may also be used for the input to the gate of M2.

Figure 10:
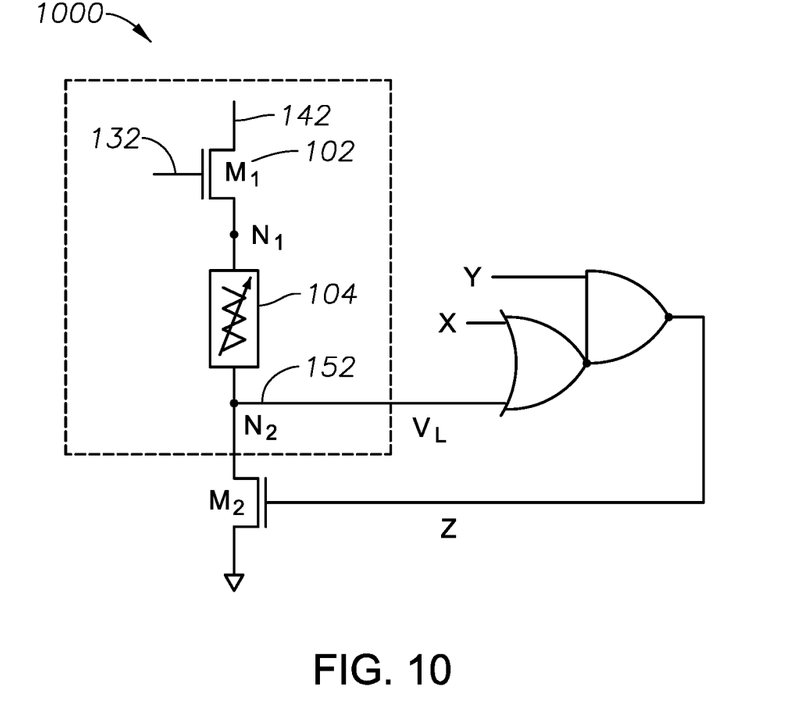
FIG. 10 is a schematic diagram of a memory cell of a memory array implementable with example methods for controlling write operations.
Figure 11:
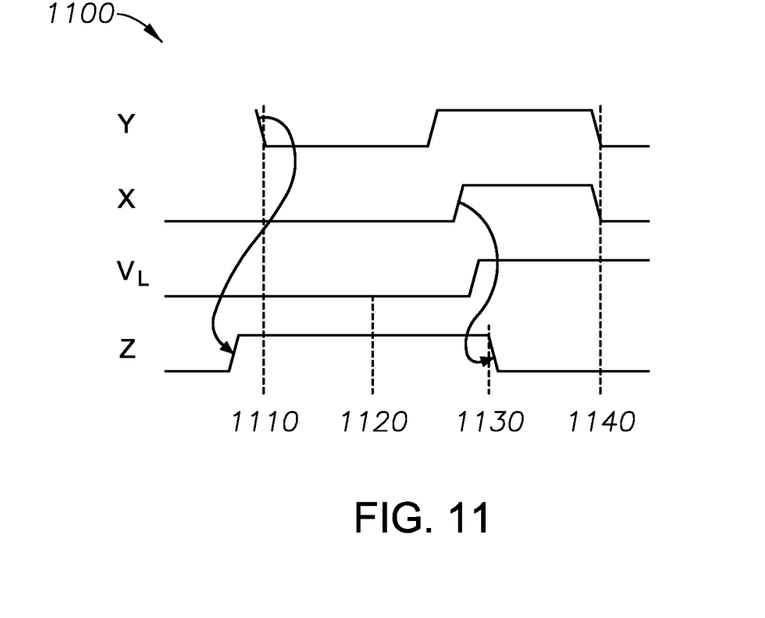
FIG. 11 is a timing diagram implementable with the schematic diagram of FIG. 10.

Referring to FIGS. 10 and 11, an example circuit for a bit-cell 1000 (FIG. 10) (e.g., RRAM, FeRAM, PCM, MRAM bit-cell, bit-cell or multi-bit cell) is shown along with an example signal timing diagram 1100 (FIG. 11). As depicted in FIG. 10, the example integrated circuit 1000 expands on the integrated circuit 800 (that includes a second access device (M2) 806 as the voltage control element) as shown in FIG. 8. In addition to the components and operations as described with reference to FIG. 8, in FIG. 10, the circuit 1000 includes an OR-AND-INVERT (OAI) gate 1012, the global write termination signal (X), and a global reset signal (Y), and a write driver signal (Z).

Moreover, similar to FIG. 1, in FIG. 10, the first access device 102 may be coupled to a word line (WL) 132 and a bit line (BL) 142, while the second access device 1006 (as the voltage control element 106) may be coupled to a source line (SL) 152. Moreover, as shown in FIG. 10, the first access device 102 is coupled in series to a programmable resistive device 104 and the second access device 1006, where the programmable resistive device 104 is configured to replace a first data value by writing a second data value in the programmable resistive device 104.

In an example operation, when the programmable device 104 transitions from HRS to LRS, the voltage ($V_L$) on the second node (N2) would rise a little bit (e.g., 100-200 mV). Hence, any circuit implementation that may detect a change in $V_L$ and as a result, would trigger a gate voltage of the second access device (N2) 1006 so as to limit the second voltage (V2), third voltage (V3), or both (i.e., reduce or terminate the write voltage of the bit-cell) can sufficiently prevent an over-SET condition and dynamically control voltage of the write operation.

In one such operation, with reference to FIGS. 10 and 11, initially prior to an operational cycle, the states of each of operational signals are reset. Accordingly, at step 1110, the global reset signal (Y) is set (or reset) to a low pulse (i.e., a digital "0" value), the write driver signal (Z) is set (or reset) to a high pulse (i.e., a digital "1" value), and $V_L$ would be set (or reset) to at a low pulse (i.e., a digital "0" value). At step 1120, upon the start of a first cycle, the method would wait for $V_L$ to rise (i.e., to a digital "1") (by a local detection of write completion). Also, at this instance, the global write termination signal (X) may be presumed to be a digital "0" value, as the example integrated circuit 1000 may locally detect the end of the write operation. Next at step 1130, upon a successful local detection of the end of the write operation, when $V_L$ rises to a digital "1", Z would fall to "0" such that the entire column of bit-cells would automatically stop their respective write operations. However, if, for example, one particular column of bit-cells does not conduct the write operation in the specific amount of time (e.g., at 100 ns when it may typically take 10-50 ns to conduct the write operation), the column of bit-cells may be corrected by error-correcting code (ECC) or by some other means. In one scenario, for example, at 100 ns, a rising signal may be sent for the global write termination signal (i.e., X="1"), and even if $V_L$ had not risen (i.e., $V_L$="1") such that the write driver signal (Z) would be "turned-off" locally (i.e., Z="0") (i.e., at the gate of the second access device (M2)). Hence, by the global write termination signal (X) going high (i.e., X="1") would "turn-off" the write driver signal (Z="0"), even if $V_L$ has not done so. Next, at step 1140, X is "turned-down" (i.e., X="0") and a negative pulse may be sent on Y to get the circuitry ready for a subsequent cycle.

In example implementations, certain circuit elements have been provided in FIGS. 1-11, whose redundant description has not been duplicated in the related description of analogous circuit elements herein. It is expressly incorporated that the same circuit elements with identical symbols and/or reference numerals are included in each of embodiments based on its corresponding figure(s).

Although one or more of FIGS. 1-11 may illustrate systems, apparatuses, or methods according to the teachings of the disclosure, the disclosure is not limited to these illustrated systems, apparatuses, or methods. One or more functions or components of any of FIGS. 1-11 as illustrated or described herein may be combined with one or more other portions of another of FIGS. 1-11. Accordingly, no single implementation described herein should be construed as limiting and implementations of the disclosure may be suitably combined without departing form the teachings of the disclosure.

Those of skill would further appreciate that the various illustrative logical blocks, configurations, modules, circuits, and algorithm steps described in connection with the implementations disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the disclosure herein may be implemented directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description is provided to enable a person skilled in the art to make or use the disclosed implementations. Various modifications to these implementations will be readily apparent to those skilled in the art, and the principles defined herein may be applied to other implementations without departing from the scope of the disclosure. Thus, the present disclosure is not intended to be limited to the implementations shown herein but is to be accorded the widest scope possible consistent with the principles and novel features as defined by the following claims.

What is claimed is:

1. A method for controlling a write operation comprising:
    providing a first voltage to a word-line coupled to a first transistor device;
    providing a second voltage to a bit-line coupled to the first transistor device;
    providing a third voltage to a source-line coupled between a programmable resistive device and a voltage control element, wherein the first transistor device is coupled to the programmable resistive device and the voltage control element, and wherein the programmable resistive device is configured to replace a first data value by writing a second data value in the programmable resistive device; and
    in response to a voltage difference across the programmable resistive device exceeding a particular threshold, limiting the voltage difference by one of reducing the second voltage on the bit-line or increasing the third voltage on the source-line;
    wherein the programmable resistive device is coupled between the first transistor device and the voltage control element.

2. The method of claim 1, wherein the voltage difference is configured to be further limited by at least one or more of the first transistor device, the programmable resistive device, and the voltage control element.

3. The method of claim 1, wherein the first transistor device, the programmable resistive device, and the voltage control element are coupled in a series arrangement.

4. The method of claim 1, wherein the voltage control element comprises one of a capacitor, a resistor, or a second transistor device.

5. The method of claim 4, wherein if the voltage control element comprises the capacitor, limiting the voltage difference is based on a rate of a change of the voltage at a node between the programmable resistive device and the voltage control element.

6. The method of claim 4, wherein if the voltage control element comprises the capacitor,
    limiting the voltage difference further comprises:
        charging a node between the programmable resistive device and the voltage control element based on the second voltage, the third voltage, or both, and a first circuit resistance-circuit capacitance (RC) time constant, wherein a first circuit resistance corresponds to a first resistance value;
        in response to the node voltage exceeding a first threshold level, at least partially decreasing the second voltage, the third voltage, or both;
        upon writing the second data value, charging the node based on the second voltage, the third voltage, or both, and a second circuit resistance-circuit capacitance (RC) time constant; and
        in response to the second voltage, the third voltage, or both corresponding to the node voltage, reducing the second voltage, the third voltage, or both.

7. The method of claim 1, wherein the voltage control element comprises one or more capacitors connected in parallel by one or more switches that are configured to dynamically provide different capacitive loads, and further comprising:

selecting one of the capacitive loads coupled to the resistive device based on predetermined characteristics of the second voltage, third voltage, or both, wherein each of the capacitive loads corresponds to a different resistance data value of the programmable resistive device.

8. The method of claim 7, wherein the selection of capacitive loads comprises:
evaluating capacitive levels nominal behavior;
shaping distributions of the capacitive loads;
evaluating based on reliability criteria, and
providing a selected capacitive load, wherein the selected capacitive load is configured to control a particular resistance data value of the resistive device, wherein if during the evaluation, errors are detected, the steps of selection further comprises:
defining capacitive levels, wherein if the capacitive levels are in a first range within a particular threshold, calibrating a selected range of capacitive loads, and wherein if the capacitive levels are in a second range outside of the particular threshold, reducing a quantity of the capacitive levels.

9. The method of claim 1, further comprising:
performing the method in a single write operational cycle.

10. The method of claim 1, wherein the resistive device stores at least one of linear or non-linear distributed resistance data values.

11. The method of claim 4, wherein if the voltage control element comprises the resistor or the transistor, limiting the voltage difference is based on a reduction of voltage across the programmable resistive element upon a transition from a high-resistive state (HRS) to a low-resistive state (LRS), wherein the reduction of the voltage corresponds to a voltage-reduction between first and second nodes on opposing sides of the programmable resistive device.

12. The method of claim 4, wherein if the voltage control element comprises the resistor, limiting the voltage difference comprises:
transitioning from a high-resistive state (HRS) to a low-resistive state (LRS);
automatically limiting the second voltage, the third voltage, or both based on a reduction of a voltage across the programmable resistive element, wherein the reduction of the second voltage, third voltage, or both corresponds to a decrease of voltage difference between first and second nodes on opposing sides of the programmable resistive device.

13. The method of claim 12, further comprising:
providing a global write termination signal to a second transistor device coupled to the resistor, wherein the programmable resistive device and the second transistor device are coupled on opposing sides of the resistor, and wherein the global write termination signal is configured to reduce or terminate a gate voltage of the second transistor device when the transition is detected.

14. The method of claim 4, wherein if the voltage control element comprises the second transistor (N2), limiting the voltage difference further comprises:
detecting a transition from a high-resistive state (HRS) to a low-resistive state (LRS); and
dynamically generating a local gate voltage to a second transistor device coupled to programmable resistive device to reduce or terminate the second voltage, the voltage, or both.

15. The method of claim 14, further comprising:
providing a global write termination signal to a second transistor device coupled to the programmable resistive device, wherein the global write termination signal is configured to reduce or terminate a gate voltage of the second transistor device when a transition from a high-resistive state (HRS) to a low-resistive state (LRS) detected.

16. An integrated circuit comprising:
a first transistor; and
a programmable resistive device, wherein the programmable resistive device is configured to replace a first data value by writing a second data value in the programmable resistive device, and wherein at least one or more of the first transistor, the programmable resistive device, and a voltage control element are configured to limit a voltage difference across the programmable resistive device, wherein:
the programmable resistive device is coupled between the first transistor and the voltage control element; and
a source-line is coupled between the programmable resistive device and the voltage control element.

17. The integrated circuit of claim 16, wherein the voltage control element comprises one of a capacitor, a resistor, or a second transistor.

18. The integrated circuit of claim 16, wherein the voltage control element comprises one or more capacitors or one or more transistors and corresponding switches having different capacitive loads.

19. The integrated circuit of claim 16, further comprising:
a second transistor coupled to the voltage control element and configured to receive a global write termination signal, wherein the programmable resistive device and the second transistor are coupled on opposing sides of the voltage control element, and wherein the global write termination signal is configured to reduce or terminate a gate voltage of the second transistor when a transition from a high-resistive state (HRS) to a low-resistive state (LRS) is detected.

20. The integrated circuit of claim 17, wherein if the voltage control element is a second transistor, further comprising an OR-AND-INVERT (OAI) gate, wherein a voltage at the second node (VL) and a global write termination signal (X) are respective first and second "OR" components of the OAI gate, wherein an output of the NOR gate and a global reset signal (Y) are respective first and second inputs to the NAND gate, wherein the global reset signal (Y) is an input to a NAND component of the OAI gate, and wherein an output of the OAI gate corresponds to a gate voltage of the second transistor.

21. The integrated circuit of claim 16, wherein the first transistor, the programmable resistive device, and the voltage control element are coupled in series.

\* \* \* \* \*